US008729739B2

(12) United States Patent
Lubomirsky et al.

(10) Patent No.: US 8,729,739 B2
(45) Date of Patent: May 20, 2014

(54) BI-DIRECTIONAL CIRCUIT BREAKER

(75) Inventors: Vadim Lubomirsky, Bet Shemesh (IL); Damian Urciuoli, Bowie, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 469 days.

(21) Appl. No.: 13/017,227

(22) Filed: Jan. 31, 2011

(65) Prior Publication Data
US 2011/0267132 A1  Nov. 3, 2011

Related U.S. Application Data

(63) Continuation-in-part of application No. 12/768,898, filed on Apr. 28, 2010.

(51) Int. Cl.
*H02B 1/24* (2006.01)

(52) U.S. Cl.
USPC ............. 307/112; 307/77; 307/55; 307/32; 330/277; 330/51; 330/107; 330/306; 361/88; 361/58; 361/111; 361/18; 361/54; 327/430; 327/431

(58) Field of Classification Search
CPC ........ H02B 1/24; H01L 27/098; H01L 24/00; H01L 2029/00; H02M 3/28
USPC ............ 357/23.4, 23.8, 23.14, 43, 55, 59, 86, 357/23, 44, 46; 330/277, 51, 107, 300, 302, 330/305, 306; 455/78, 84; 361/88, 58, 54, 361/56, 57, 91, 111, 18; 327/430, 431; 257/328, 329, 334, 266; 307/271.3, 307/300, 43–46, 592, 404, 55, 77, 272.3, 32
See application file for complete search history.

(56) References Cited

U.S. PATENT DOCUMENTS

| 4,571,606 | A | * | 2/1986 | Benjamin et al. | ............. 257/339 |
| 4,611,123 | A | | 9/1986 | McDonald | |
| 5,057,791 | A | * | 10/1991 | Thompson et al. | ............ 330/277 |
| 5,066,869 | A | * | 11/1991 | Neidorff | ....................... 327/143 |
| 5,216,352 | A | | 6/1993 | Studtmann | |

(Continued)

OTHER PUBLICATIONS

Krishnaswami, S., et al., "Gate oxide reliability of 4H-SiC MOS devices," Intl. Reliability Physics Symp., 2005, pp. 592-593.

(Continued)

*Primary Examiner* — Fritz M Fleming
*Assistant Examiner* — Jagdeep Dhillon
(74) *Attorney, Agent, or Firm* — Eric B. Compton

(57) ABSTRACT

A circuit breaker comprising first and second JFETs, each comprising a gate, drain and source connection, the JFETs sources being operatively connected to each other to form a common-source connection and adapted to be connected to and operating to open an external circuit when the current flowing through the JFETs exceeds a predetermined threshold, the JFETs' gates, and common-source connection being operatively connected to a gate driver circuit which causes the JFETs to turn off when the predetermined threshold is exceeded; whereupon the current flows through the common-source connection into the second gate and into the gate driver circuit which causes the gate driver circuit to turn off the first and second JFETs and open the circuit breaker. Also claimed is a method of sensing an overloaded circuit comprising leading and trailing JFETs in a circuit that open the circuit and prevent current flow when a predetermined threshold is exceeded.

20 Claims, 15 Drawing Sheets

(56) References Cited

U.S. PATENT DOCUMENTS

| | | | |
|---|---|---|---|
| 5,463,252 | A | 10/1995 | Jones et al. |
| 5,583,384 | A | 12/1996 | Henry |
| 5,606,482 | A | 2/1997 | Witmer |
| 5,714,777 | A | 2/1998 | Ismail et al. |
| 5,726,848 | A | 3/1998 | Boenig |
| 5,742,463 | A * | 4/1998 | Harris .................. 361/88 |
| 6,034,385 | A | 3/2000 | Stephani et al. |
| 6,178,077 | B1 | 1/2001 | Kaluza et al. |
| 6,876,245 | B2 | 4/2005 | de Buda |
| 7,072,162 | B2 | 7/2006 | D'Amato |
| 7,199,491 | B2 | 4/2007 | Novinsky et al. |
| 7,436,642 | B2 | 10/2008 | Grisoni |
| 7,745,273 | B2 | 6/2010 | Treu et al. |
| 7,768,758 | B2 | 8/2010 | Maier et al. |
| 8,130,023 | B2 * | 3/2012 | Veliadis .................. 327/430 |
| 2006/0198173 | A1 | 9/2006 | Rozman et al. |
| 2008/0204958 | A1 * | 8/2008 | Shearon et al. .............. 361/93.9 |
| 2009/0033293 | A1 | 2/2009 | Xing et al. |
| 2010/0277006 | A1 * | 11/2010 | Urciuoli .................. 307/130 |

OTHER PUBLICATIONS

Urciuoli, D.P. et al., "Bi-directional Scalable Solid-State Circuit Breakers for Hybrid-electric Vehicles," International Journal of High Speed Electronics and Systems, vol. 19, No. 1 (2009) pp. 183-192.

Veliadis, V. et al., "Exploring the design space of rugged seven lithographic level silicon carbide vertical JFETs for the development of 1200-V, 50-A devices," 2007 Int. Semiconductor Device Research Symp., 2007, pp. 1-2.

Veliadis, V., et al., "A 2055-V (at 0.7 mA/cm2), 24-A (at 706 W/cm2) normally-ON 4H-SiC JFET with 0.068-cm2 active area and blocking voltage capability of 94% of the SiC material limit," IEEE Electron Device Lett., vol. 29, No. 12, pp. 1325-1327, Dec. 2008.

Veliadis, V., et al., "A 1680 V (at 1 mA/cm2), 54 A (at 780 W/cm2) normally-ON 4H-SiC JFET with 0.143 cm2 active area," IEEE Electron Device Lett, vol. 29, No. 10, pp. 1132-1134 Oct. 2008.

Urciuoli, D.P., "Evaluation of SiC VJFET Devices for Scalable Solid-State Circuit Breakers," ARL-MR-0693, Army Research Laboratory, May 2008.

Veliadis, V., A 9-kV Normally-On Vertical Channel SiC JFET for Unipolar Operation, IEEE Electron Device Letters, vol. 31, No. 5, May 2010.

Stephani, D., et al., "Silicon carbide junction field effect transistors," Int. J. of High Speed Electronics and Syst., vol. 16, No. 3, pp. 825-854, Sep. 2006.

Magnus Willander et al., "Silicon carbide and diamond for high temperature device applications," Journal of Materials Science: Materials in Electronics 17 (2006) 1-25.

\* cited by examiner

FIG. 1 PNP and NPN BJT implementation of UJT (left) equivalent representation (right)

FIG. 2 UJT and PNP/NPN BJT evaluation circuit for triggering and conduction

FIG. 11 Common-source JFET and bidirectional snubber BDSSCB design

FIG. 12 Packaged 30-A BDSSCB JFET module

BI-DIRECTIONAL CIRCUIT BREAKER

CROSS-REFERENCE TO RELATED APPLICATIONS

This application is a continuation-in-part of and claims priority to U.S. application Ser. No. 12/768,898 entitled "Solid State Circuit Breaker," listing as inventor Damian Urciuoli, filed Apr. 28, 2010, hereby incorporated by reference.

STATEMENT OF GOVERNMENT INTEREST

The invention described herein may be manufactured, used, and licensed by or for the United States Government.

FIELD OF INVENTION

This invention relates broadly to circuit breakers and in particular to circuit breakers comprising integrated circuits.

BACKGROUND OF THE INVENTION

The present invention is directed to, inter alia, bidirectional current flow applications. In addition to AC systems, many DC power electronic systems have bidirectional current flow through a single power distribution bus. Commonly, these systems supply energy to and from electrical storage elements. Other AC and DC systems operate between active power sources and/or potential power sources. In these cases, a fault can result in an over-current condition in either direction in the system. Some examples of these systems include hybrid electric vehicle drives, grid-tie photovoltaic inverter systems, and bidirectional DC-DC converters. Such systems cover a wide range of power levels, generally require fault protection, and benefit further from bidirectional fault protection.

For distributed and off-grid power systems and hybrid-electric ground vehicle power systems, power electronic converters and power distribution equipment operating at up to several hundred volts and up to hundreds of kilowatts are being developed. To prevent damage to converters or other system components during fault conditions, fault current interrupt speeds in tens to hundreds of microseconds are necessary. In many of these systems, AC and DC power components operate between two voltage busses having independent sourcing capability, and require bidirectional fault isolation. Such conditions can require fault protection systems having symmetric ratings for bidirectional voltage blocking in the off-state and bidirectional current conduction in the on-state.

In many applications, bidirectional fault isolation is provided by mechanical contactors or relays. However, mechanical fault protection devices often do not have adequate actuation speeds for protection of solid-state system components. Furthermore, these mechanical devices can suffer severe degradation, dramatically reducing operating life, or resulting in catastrophic system failure.

BRIEF SUMMARY OF THE INVENTION

A preferred embodiment comprises a gate driver designed to enable an inherent hardware over-current protection feature usable, for example, for high speed scalable bidirectional solid-state circuit breakers (BDSSCBs). The gate driver operates to sense bipolar gate current in reverse conducting junction field effect transistors (JFETs) connected in a series common-source configuration, and to provide proper gate control to transition the JFETs to the non-conducting (off) state.

A preferred embodiment circuit breaker comprises first and second JFETs; the first JFET comprising a first gate, first drain and first source connection, the second JFET comprising a second gate, second drain and second source connection; the first and second sources being operatively connected to each other to form a common-source connection, the first and second drains adapted to be connected to an external circuit having a current flowing therein, the circuit breaker operating to open the external circuit when the current flowing through the JFETs exceeds a predetermined threshold, the first and second gates, and common-source connection being operatively connected to a gate driver circuit which causes the JFETs to turn-off when the predetermined threshold is exceeded; whereby when a predetermined threshold is exceeded, the current flows through the common-source connection, through the gate driver circuit and into the second gate which causes the gate driver circuit to turn-off the first and second JFETs and thereby open the circuit breaker.

The preferred embodiment may optionally provide two control lines for external independent or synchronized JFET gate control. These lines can be used for manual control or for actuation from the output of other sensors or devices. For example, optical couplers may be utilized which may be activated by light emitting diodes responsive to manual operation or a sensed condition, such as a predetermined current level.

BRIEF DESCRIPTION OF THE DRAWINGS

A more complete appreciation of the invention will be readily obtained by reference to the following Description of the Preferred Embodiments and the accompanying drawings in which like numerals in different figures represent the same structures or elements. The representations in each of the figures are diagrammatic and no attempt is made to indicate actual scales or precise ratios. Proportional relationships are shown as approximates.

DETAILED DESCRIPTION OF PREFERRED EMBODIMENT

Figure 1:
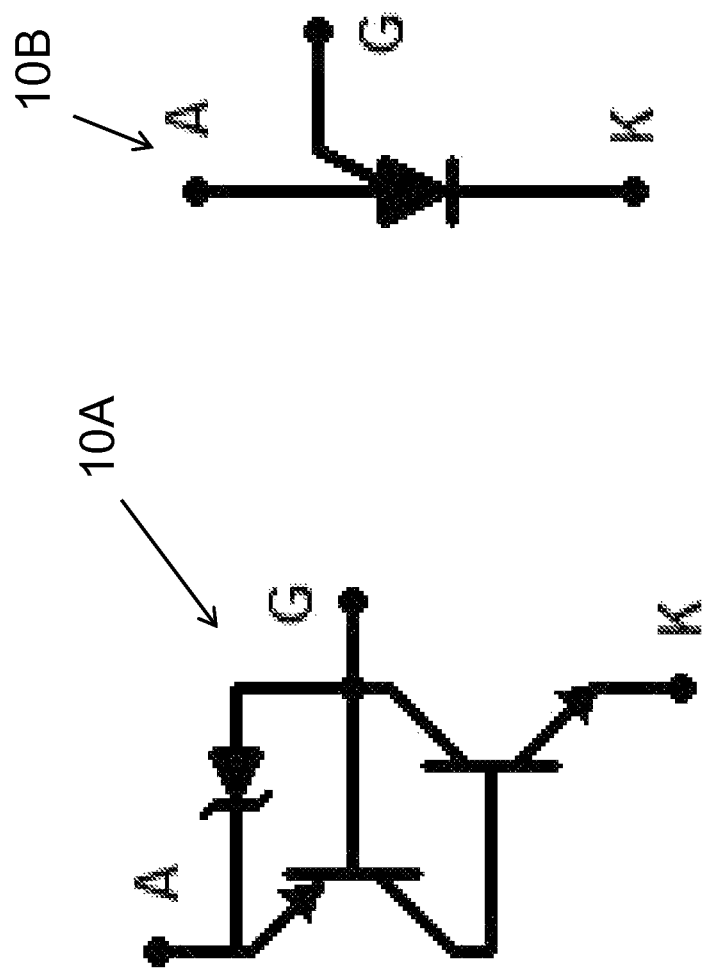
FIG. 1 schematically illustrates a complementary pair of PNP and NPN BJTs connected to provide a similar function to a unijunction transistor (UJT).

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those skilled in the art to practice the embodiments of the invention. Accordingly, the examples should not be construed as limiting the scope of the embodiments of the invention.

The terminology used herein is for the purpose of describing particular embodiments only and is not intended to limit the full scope of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as an object, layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions, layers and/or sections, these elements, components, regions, layers and/or sections should not be limited by these terms. For example, when referring first and second JFETs in a pair, these terms are only used to distinguish one JFET from another JFET. Thus, a first JFET, element, component, region, layer or section discussed below could be termed a second JFET, element, component, region, layer or section without departing from the teachings of the present invention.

Furthermore, relative terms, such as "lower" or "bottom" and "upper" or "top," may be used herein to describe one element's relationship to other elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below. Furthermore, the term "outer" may be used to refer to a surface and/or layer that is farthest away from a substrate.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region or object illustrated as a rectangular will, typically, have tapered, rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will also be appreciated by those of skill in the art that references to a structure or feature that is disposed "adjacent" another feature may have portions that overlap or underlie the adjacent feature.

Because mechanical contactors do not provide adequate actuation speeds in many applications, and suffer severe degradation during repeated fault isolation, a solid-state circuit breaker (SSCB) is required. A set of normally-on junction gate field effect transistor (JFET) devices fabricated from wide band gap semiconductor material having a collectively low conduction loss to provide large current handling capability and fast transition speed for current interruption can be applied. Advanced gate drivers are being developed for Silicon Carbide (SiC) vertical JFET (VJFET) devices. These JFET devices have voltage blocking ratings at or above 1200 V and low drain-to-source resistances for scalable bidirectional solid-state circuit breaker (BDSSCB) applications.

In contrast to mechanical devices, bidirectional solid-state circuit breakers (BDSSCBs), even coupled with transient voltage suppression components, can be actuated three orders of magnitude faster. Although practical BDSSCBs have higher conduction voltage drops than their mechanical counterparts, current scalable designs can dramatically reduce on-state losses, and semiconductor packaging techniques can enable adequate cooling. BDSSCBs facilitate dramatic improvements in reliability and operating life, resulting in superior system protection and reduced system maintenance and repair.

As JFET designs have been modified for more normally-on operation, the magnitude of negative gate biases required to block the rated 1200-V drain voltage have increased. Therefore, gate drivers operating at more negative drive voltages may be needed for more normally-on devices. Additionally, gate driver components having ratings supporting more negative gate biases will provide more voltage margin in the BDSSCB gate driver implementation. The 1200-V rated 0.1-cm$^2$ SiC JFETs, used in a scaled experimental test, were biased in the off-state using a gate-to-source voltage of −33 V. The bias level was the minimum magnitude for meeting the full blocking rating of the JFETs, and was selected to provide an operating margin for the 40-V maximum blocking rating of the unijunction transistor (UJT). Because UJT device applications are limited, very few UJT devices are available commercially, thereby limiting UJT device parameters. This combination of factors has necessitated an alternate solution to replace the discrete UJT device.

Figure 2:
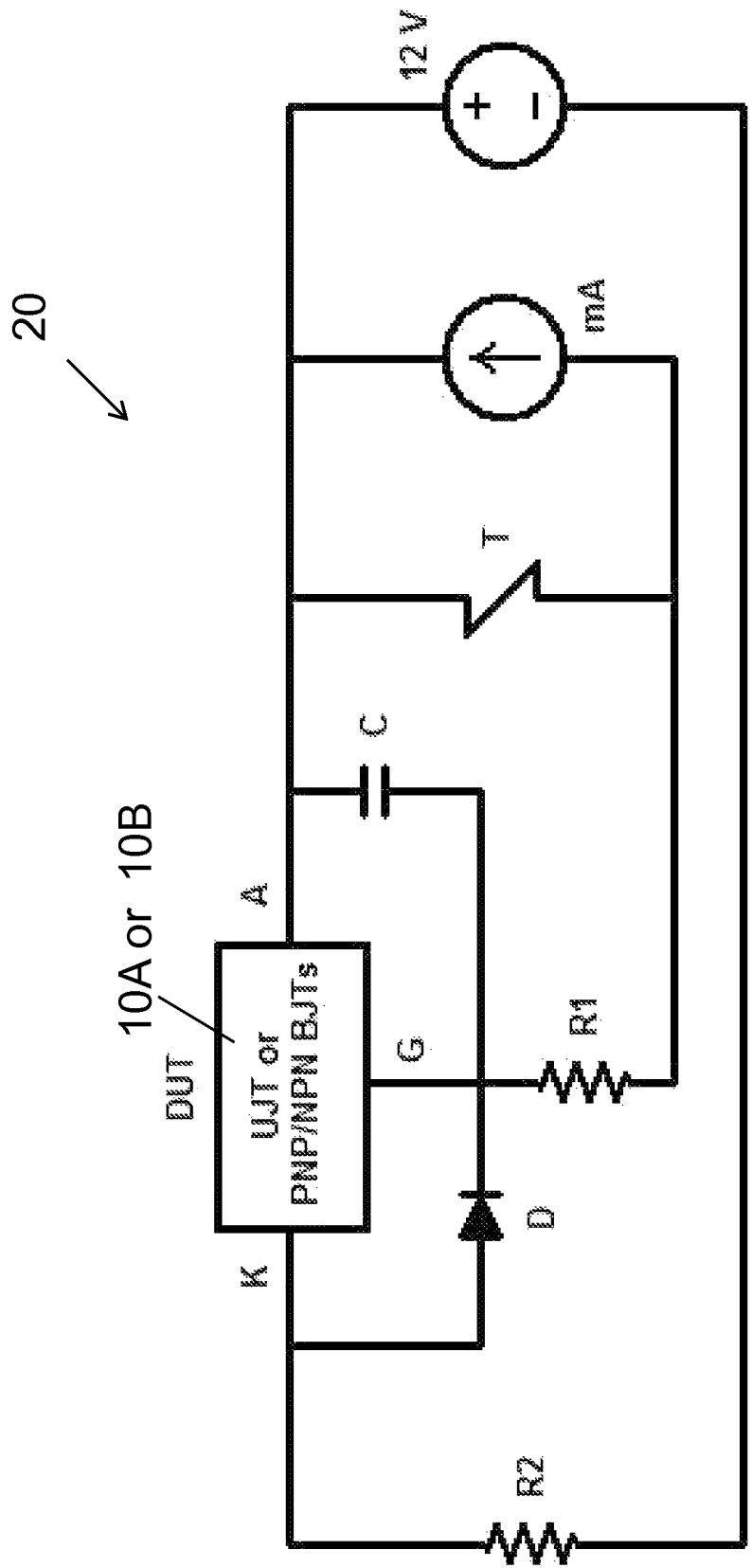
FIG. 2 schematically illustrates a test circuit designed to evaluate device triggering and effective anode-to-cathode conduction current of the complementary pair of PNP and NPN BJTs connected to provide a similar function to a UJT.

A complementary pair of PNP and NPN BJTs can be connected as shown in FIG. 1 to provide a similar function to the UJT. PNP and NPN BJTs of a 60-V rated dual complementary pair were evaluated in place of the UJT device, in the test circuit shown in FIG. 2. The test circuit was designed to evaluate device triggering and effective anode-to-cathode conduction current. The BJT configuration triggered at a similar level to that of the UJT and conducted an effective anode-to-cathode continuous current in excess of 100 mA. Both results indicate that the complementary BJT configuration can be used to replace the UJT device and to provide higher effective anode-to-cathode voltage blocking. The maximum effective anode-to-gate blocking voltage of the complementary BJT configuration is typically 5 V, compared to the 40-V rating for that of the UJT. However, because a large resistance is connected in series with the gate of either device in the BDSSCB gate driver application, a low voltage zener diode can be placed across the anode-to-gate connections, as shown in FIG. 1, without incurring significant power dissipation in either the zener diode or the series gate resistor. The BJT implementation can support more negative BDSSCB drive voltages while offering a greater selection of components.

JFETs in the Series Common-Source Configuration

Figure 3:
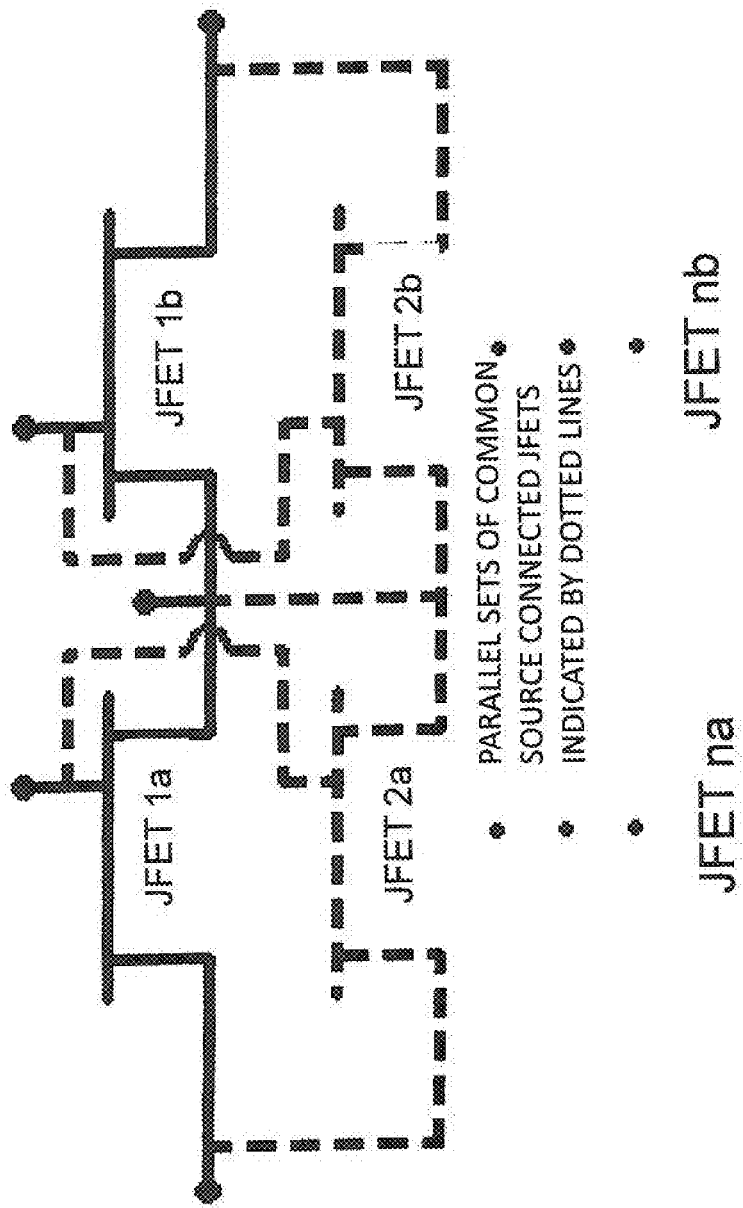
FIG. 3 is a schematic illustration of series common-source connected JFETs with additional parallel sets of common-source connected JFETs indicated by dotted outlines.
Figure 4:
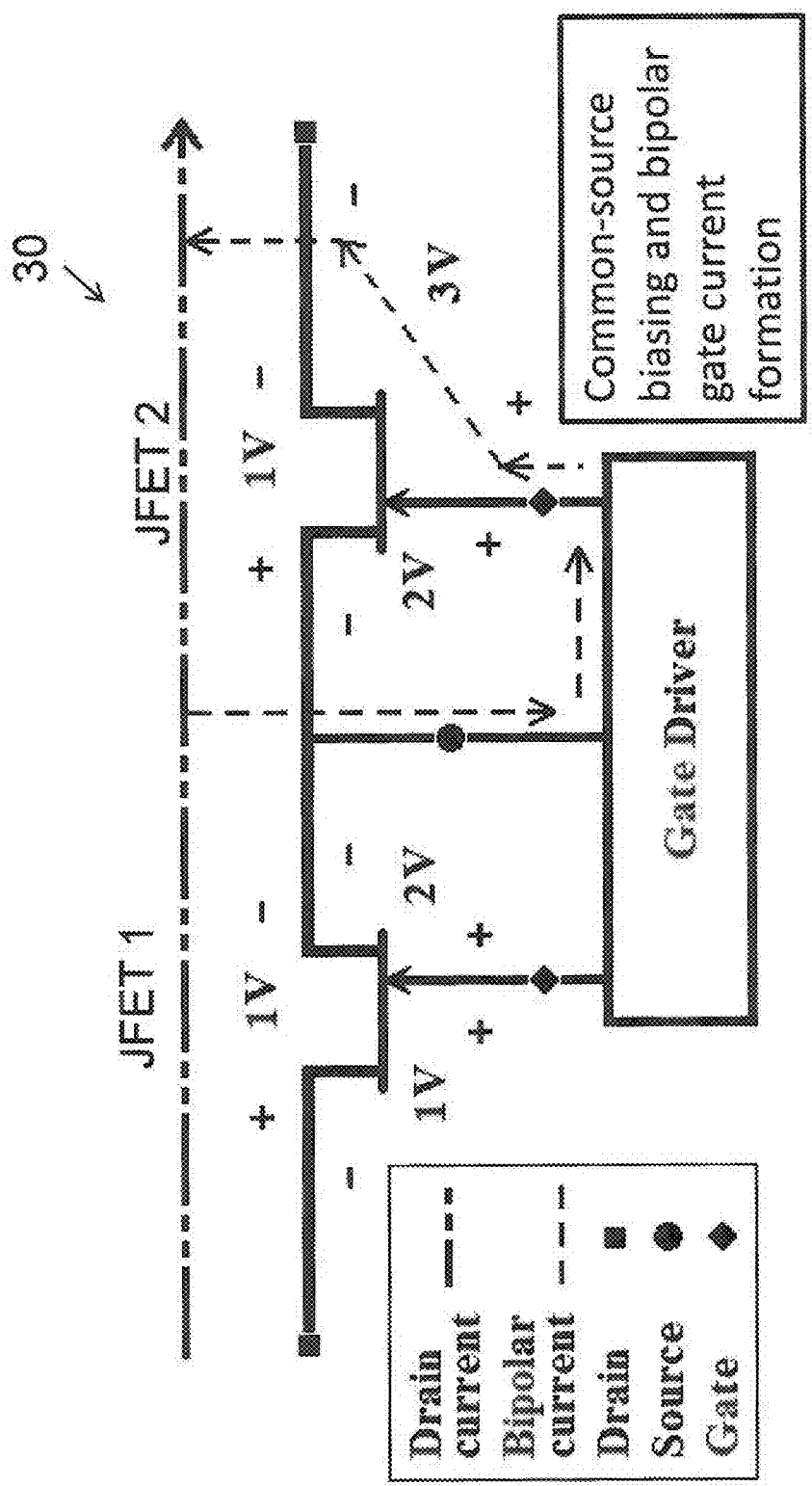
FIG. 4 schematically illustrates an example common-source biasing condition resulting in bipolar gate current flow. The bias levels shown are representative and should not be construed to be the only bias levels for which bipolar gate current flows in the bidirectionally conducting common-source JFET structure described herein.

The series common-source configuration of JFETs for the Bidirectional Solid State Circuit Breaker (BDSSCB) implementation necessitates that a JFET or set of parallel JFETs reverse conduct during BDSSCB conduction in either direction. FIG. 3 shows a schematic of JFETs in a common-source configuration with additional parallel sets of common-source connected JFETs indicated by dotted outlines. For simplicity, a bidirectional solid-state circuit breaker (BDSSCB) structure having only two JFETs connected in a common-source configuration is discussed through the following sections. However, similar effects are applicable to a plurality of common-source connected JFETs with those entities connected in parallel. Reverse conduction occurs when positive current is passed through the JFET from source-to-drain. For a reverse conducting JFET, a negative $V_{DS}$ is established. If a positive gate-to-source bias is applied to the reverse conducting JFET, this voltage will add with the source-to-drain conduction drop to increase the gate-to-drain bias ($V_{GD}=V_{GS}+V_{SD}$). If the $V_{GD}$ bias exceeds the gate-to-drain junction built-in potential of approximately 2.7 V, a bipolar gate current will form as a result of forward conduction of the parasitic diode that exists at that junction. This effect is shown schematically using example voltages in FIG. 4. The bipolar gate current can be continuous, and is fed by a portion of drain-to-source current that flows through a path formed by the gate driver circuit and gate-to-drain junction of the reverse conducting JFET. The bipolar gate current path is also illustrated in FIG. 4. Bipolar gate current is generally undesirable for both gate driver and device operation.

Reducing or eliminating the positive gate-to-source bias applied to the reverse conducting JFET can increase its source-to-drain current for which no bipolar gate current exists. This occurs because a reduction in $V_{GS}$ allows a larger $V_{SD}$, resulting in a $V_{GD}$ less than 2.7 V. However, for JFETs designed to have a significant reduction in conduction loss by the application of a positive $V_{GS}$ bias, a reduced $V_{GS}$ bias will lead to higher on-state voltage drops for a given device current. Instead, JFETs having a more normally-on or very normally-on (VNON) characteristic show less on-state resistance reduction from positive gate bias, and can be implemented in this bidirectional solid-state circuit breaker (BDSSCB) application. Using a zero-volt gate bias, reverse conducting VNON JFETs can be operated over a wider drain current range without the formation of bipolar gate current. The zero-volt gate bias also reduces the complexity of gate driver circuitry. However, the negative $V_{GS}$ bias required for voltage blocking up to 1200 V may be lower for VNON JFETs than that for other JFETs.

BDSSCB Bipolar Gate Current Actuated Gate Driver

Bidirectional Solid-State Circuit Breaker (BDSSCB) applications have various electrical and thermal operating conditions. At higher device temperatures, JFET on-state resistance increases causing a higher conduction voltage drop and higher device power dissipation. Under such operating conditions, JFET current ratings are reduced and bipolar gate current forms at lower reverse conduction currents. Also, any currents including short duration pulses in excess of the rated JFET reverse current can cause undesired bipolar gate current. Because the $V_{SD}$ values that cause bipolar gate current can be slightly greater than or equal to the maximum $V_{SD}$ values of device power dissipation limits, the presence of bipolar gate current can be used to determine if the BDSSCB should be transitioned to the off-state. A gate driver circuit was designed and built to sense bipolar gate current in reverse conducting VNON JFETs and to provide proper gate control to transition the JFETs to the off-state. The driver circuit maintains (latches) the JFETs in the off-state after bipolar gate current is detected to avoid a possible oscillatory condition or a possible drain current regulation condition caused by operation in the linear region rather than operation in the saturation or cutoff regions. The driver also provides two isolated input control lines for external independent or synchronized JFET gate control. These lines can be used for manual control or for actuation from the output of other sensors or devices.

Figure 5:
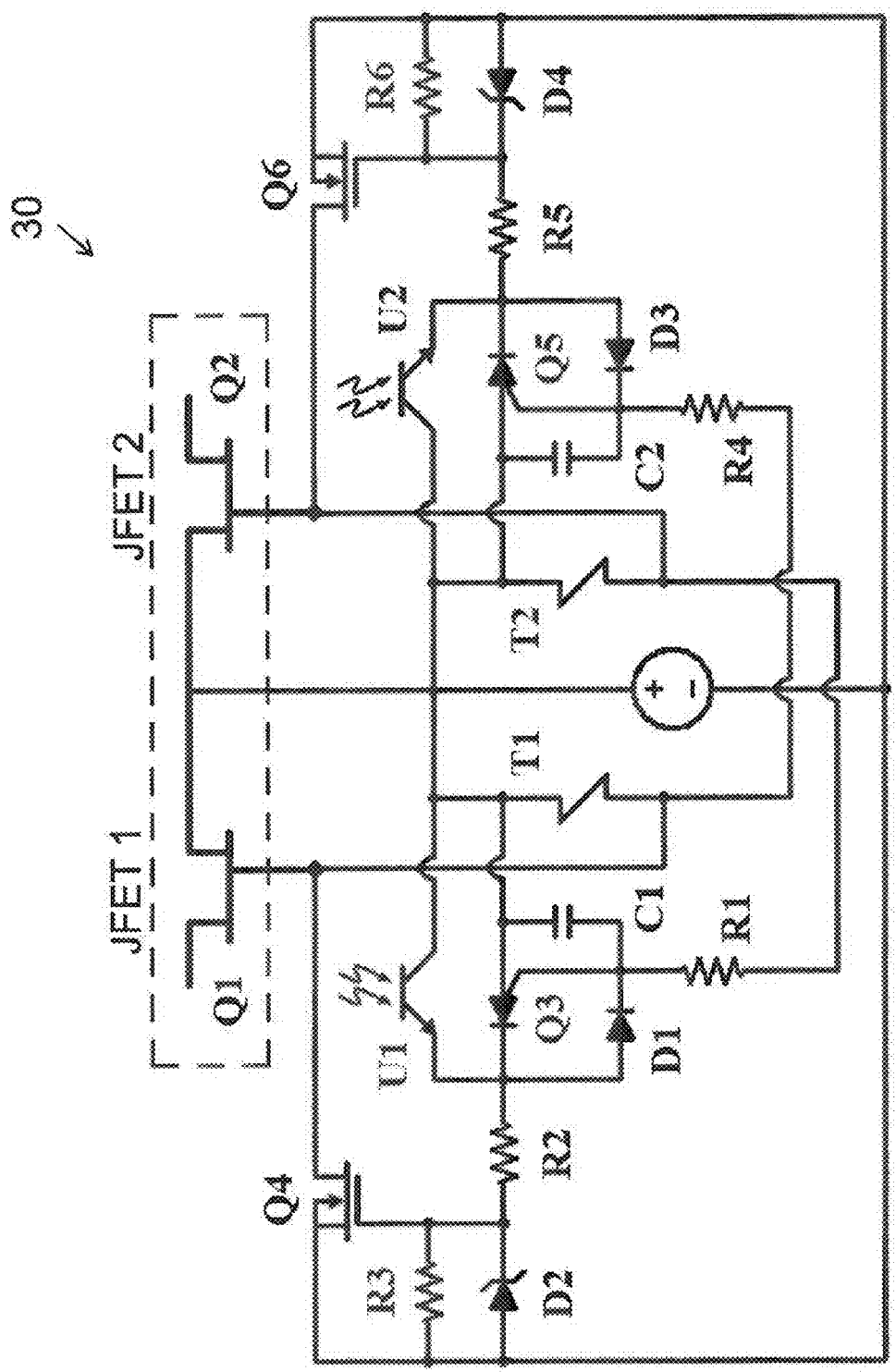
FIG. 5 is a schematic illustration of bipolar current actuated JFET gate driver circuit with two auxiliary optically isolated control channels.

FIG. 5 schematically illustrates a preferred embodiment bipolar gate current actuated driver (BCAD) circuit wherein when a bipolar gate current flows into the gate of either JFET (Q1, Q2) while reverse conducting, the bipolar gate current will flow into the gate driver circuit through the common-source connection. The BDSSCB bipolar gate current actuated gate driver circuit of FIG. 5 includes two optional auxiliary optically isolated control channels. The BDSSCB is represented by two JFETs connected in a series common-source configuration shown in a dotted outline. The negative gate voltage bias is provided by a DC power supply with the positive terminal connected to the common-sources of the JFETs. A circuit connected to each JFET gate provides actuation from bipolar gate current and from an external input. In the following discussion, labels in braces { } refer to components shown in FIG. 5. When a bipolar gate current enters the gate of either JFET {Q1, Q2} while reverse conducting (source-to-drain current), the bipolar gate current will flow into the gate driver circuit through the common-source connection. A resettable fuse or other device that opens at a set current level {T1, T2} conducts the bipolar gate current, and a resistive voltage drop forms across that resettable device. When the voltage reaches the anode-to-gate trigger voltage or offset voltage of the unijunction transistor (UJT) {Q3, Q5} connected across the resettable device, the UJT will turn-on and conduct current from anode-to-cathode sourced by the gate bias DC power supply. A high speed diode {D1, D3} is used with its cathode and anode connected to the gate and cathode, respectively, of the UJT to prevent a gate-to-cathode reverse voltage in excess of the rated value. A capacitor {C1, C2} is connected between the anode and gate of the UJT to prevent undesired triggering of the UJT from circuit transients, and a resistor {R1, R4} is connected in series with the UJT gate to limit gate current. Together, the capacitor {C1, C2} and resistor {R1, R4} act as a low-pass filter. A resistor {R2, R5} and zener diode {D2, D4} connected in series with the UJT provide a fixed gate voltage for the MOSFET {Q4, Q6} that has its drain connected to the gate of the forward conducting JFET (in this example), and its source connected to the negative terminal of the JFET gate bias supply. After the UJT begins to conduct, the MOSFET is gated-on, connecting the negative terminal of the DC power supply to the forward conducting JFET gate. The resettable device in parallel with the gate-to-source junction of the forward conducting JFET is forced to conduct current until it reaches its non-conducting state, and the JFET negative gate bias is applied to turn-off the forward conducting JFET. Before its transition to a non-conducting state, the current through the resettable device triggered a similar sequence of events on the set of devices controlling the gate potential of the reverse conducting JFET, thereby biasing it to the off-state an interval of time after the turn-off of the JFET that was previously forward conducting. The time interval between forward and reverse conducting JFET device transitions to the off-state is determined in part by the values of the capacitors connected across the anode and gate of the UJTs and by the resistors connected in series with the UJT gates. By gating the forward conducting JFET to the off-state before gating the reverse conducting JFET to the off-state, the reverse conducting JFET is protected from a source-to-drain voltage in excess of its reverse blocking capability.

Two auxiliary optically isolated control channels allow external gate driver actuation. The open collector BJT output of an optocoupler {U1, U2} is connected in parallel with each UJT with the BJT collector and emitter connected to the UJT anode and cathode, respectively. The optocouplers can be turned-on individually to select the order in which the JFETs are turned-off, or the optocouplers can be turned-on simultaneously to provide synchronized JFET turn-off transitions. External actuation can be achieved by either holding one or both optocouplers in the on-state, or by momentarily turning-on one or both optocouplers. In either the bipolar gate current actuated or externally actuated modes of JFET turn-off, the gate driver output maintains (latches) the JFET off-state bias until the voltage of the gate bias supply is brought to zero or nearly zero volts. If still in the on-state, the optocouplers can be turned-off, and the gate bias supply voltage can be restored to resume conduction through the BDSSCB.

Scaled Experimental Testing

Figure 6:
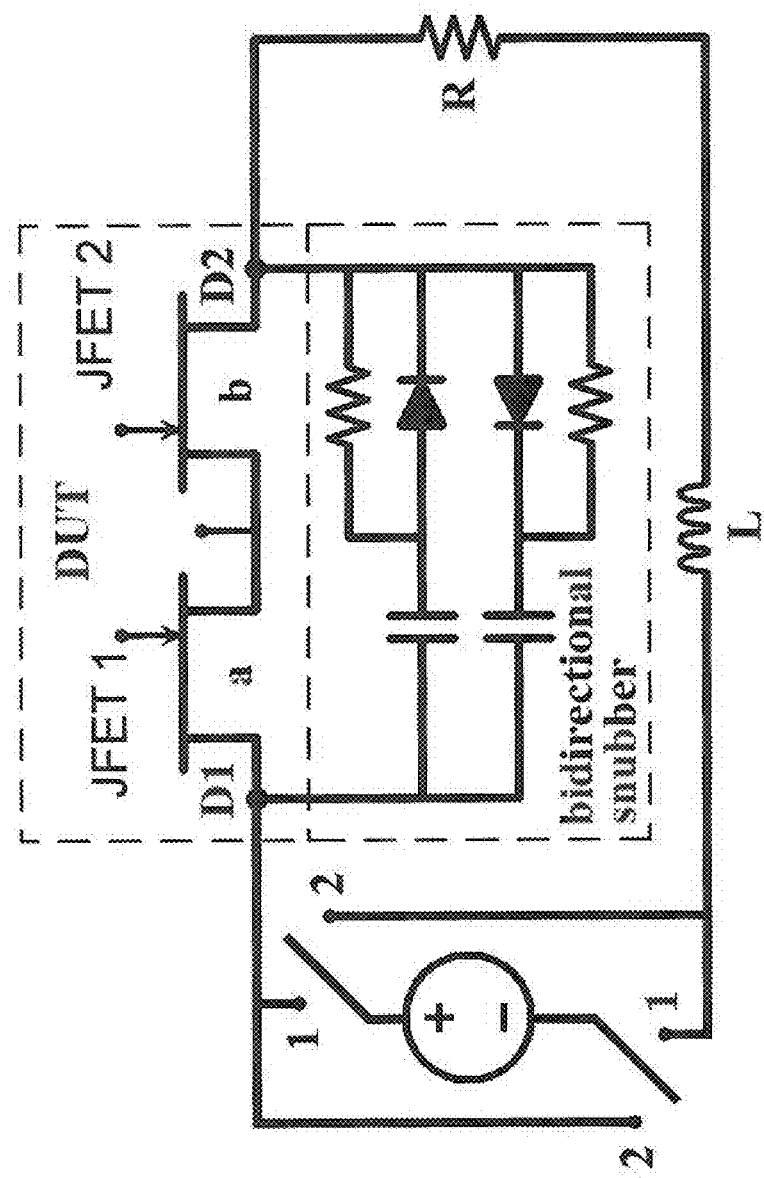
FIG. 6 is a schematic illustration of a BDSSCB Test Circuit used to evaluate bipolar gate current actuated JFET gate driver.

A gate driver configuration was designed in accordance with the principles of the present invention, built, and successfully evaluated to enable an inherent hardware over-current protection feature for high speed scalable bidirectional solid-state circuit breakers (BDSSCBs). The gate driver configuration was also evaluated under manual actuation using the input control lines for external synchronized JFET gate control. The gate driver configuration of FIG. 5 was built and tested with two 1200-V rated 0.1-cm$^2$ VNON SiC VJFETs connected in the common-source configuration. An isolated DC-DC converter with adjustable output voltage regulation was built to provide JFET gate bias voltages of −33 V, resulting in JFET drain-to-source blocking voltages of 1200 V. FIG. 6 shows the schematic of the BDSSCB test circuit. An isolated DC power supply was used as a source, and a resistive load of 53.6 ohms was connected in series with the JFETs. A bidirectional snubber was connected in parallel with the BDSSCB at the two JFET drain terminals. The section labeled DUT (device under test) represents the BDSSCB, which incorporates the bidirectional snubber. The setup allowed the connections of the DC power supply to be easily interchanged for bidirectional testing. The gate driver was demonstrated with two 1200-V, 10-A rated 0.1 cm$^2$ VNON SiC VJFETs in the BDSSCB test circuit, and performed well in both external and bipolar gate current actuated modes.

Figure 7:
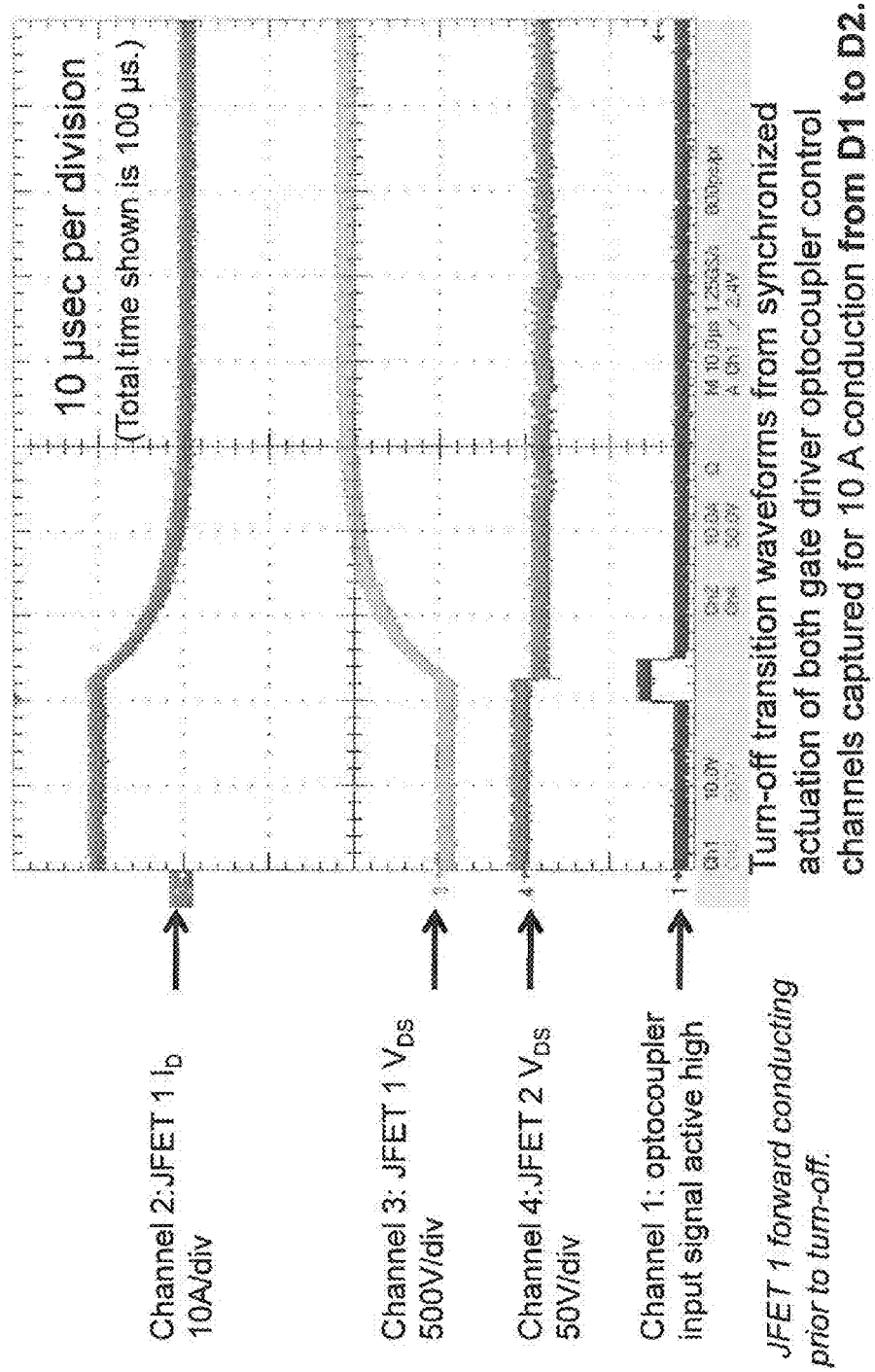
FIG. 7 is a graphical illustration of turn-off transition waveforms from synchronized actuation of both gate driver optocoupler control channels shown at 10 μsec per division captured for a 10-A conduction from D1 to D2 (specifically JFET device number 1 forward conduction prior to turn-off).
Figure 8:
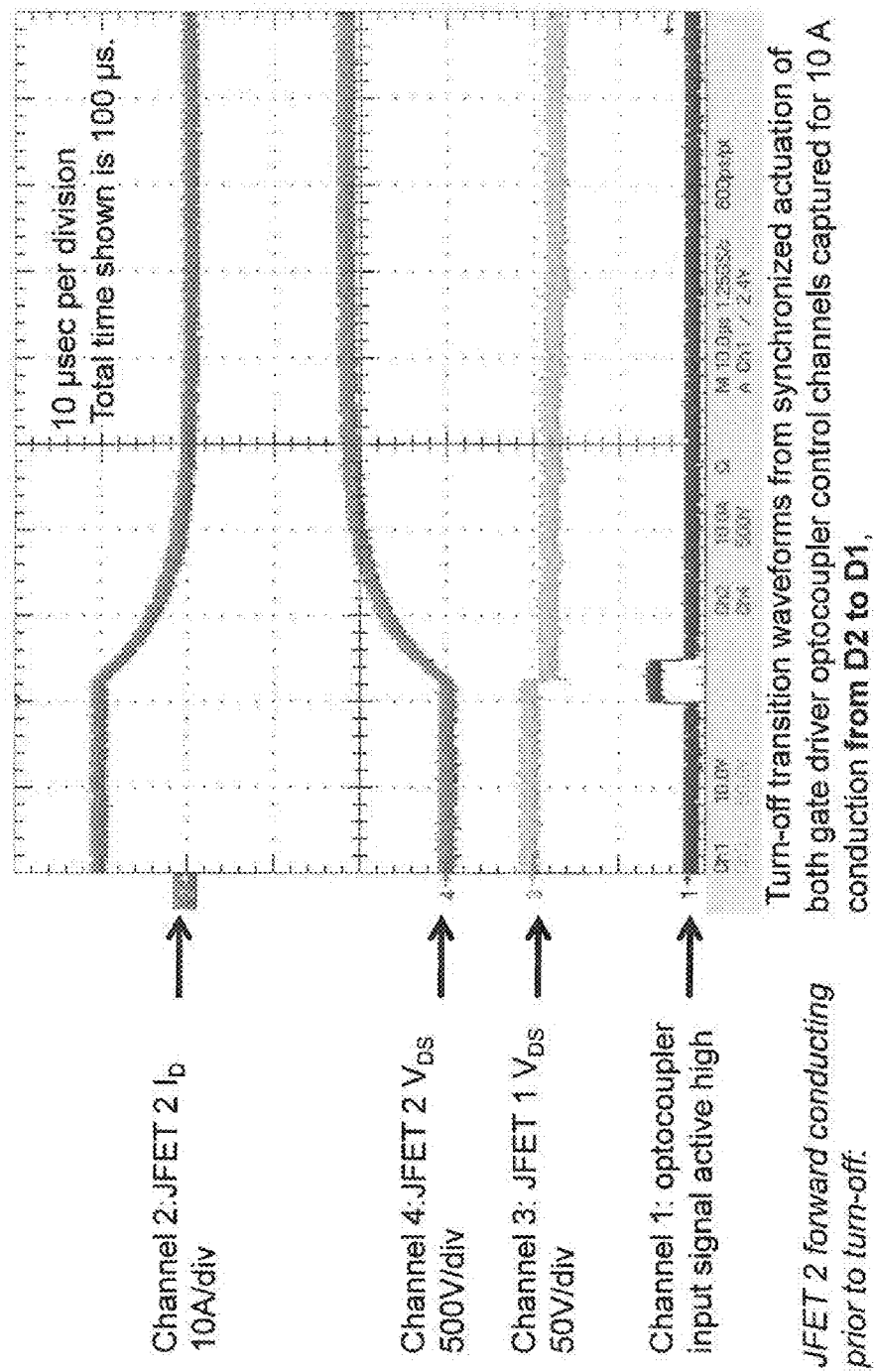
FIG. 8 is a graphical illustration of turn-off transition waveforms from synchronized actuation of both gate driver optocoupler control channels shown at 10 μsec per division captured for 10-A conduction from D2 to D1 (specifically JFET device number 2 forward conduction prior to turn-off).

Synchronized actuation of both optocoupler control channels of the gate driver was tested first. Each test was begun by increasing the test circuit power supply voltage until the desired JFET drain current was measured. Both optocoupler inputs were then driven in parallel by a manually triggered function generator with a pulse having an amplitude of 5 V and a duration of 5 μs. BDSSCB currents from 2 A to 10 A in 1-A increments were tested. In each test, the JFET turn-off delay (the time between the start of the optocoupler input pulse and the start of JFET turn-off) was consistently 2.7 μs. No delay was observed between the JFETs at turn-off. FIG. 7 shows the waveforms acquired from the 10 A test with current flow from D1 to D2 (referring to those labels in FIG. 6). Channels 1 through 4 correspond to the following waveforms: channel 1: synchronized optocoupler input signal-active high; channel 2: JFET 1 $I_D$, 10 A/div; channel 3: JFET 1 $V_{DS}$, 500 V/div; channel 4: JFET 2 $V_{DS}$, 50 V/div. FIG. 8 shows the waveforms acquired from the 10 A test with current flow from D2 to D1 (referring to those labels in FIG. 6). Channels 1 through 4 correspond to the following waveforms: channel 1: synchronized optocoupler input signal-active high; channel 2: JFET 2 $I_D$, 10 A/div; channel 3: JFET 1 $V_{DS}$, 50 V/div; channel 4: JFET 2 $V_{DS}$, 500 V/div. In all tests of this operating mode, the gate driver performed as expected. Although individual JFET turn-off transitions occur on the nanosecond time scale, the parallel bidirectional snubber slowed the total BDSSCB transition time to approximately 20 µs.

Figure 9:
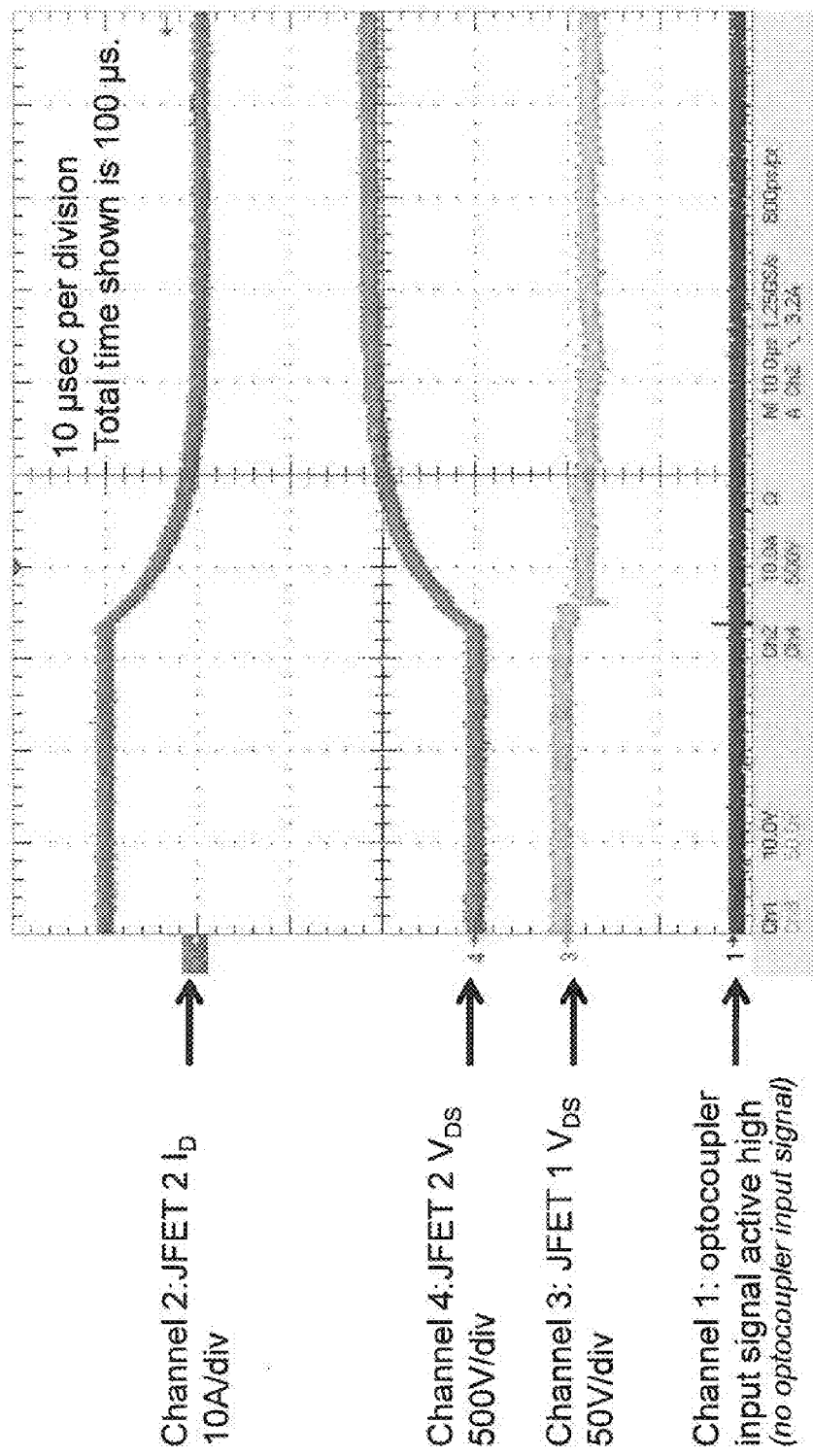
FIG. 9 is a graphical illustration of turn-off transition waveforms from bipolar gate current actuation shown at 10 μsec per division captured for conduction from D2 to D1 (specifically JFET device number 2 forward conduction prior to turn-off).
Figure 10:
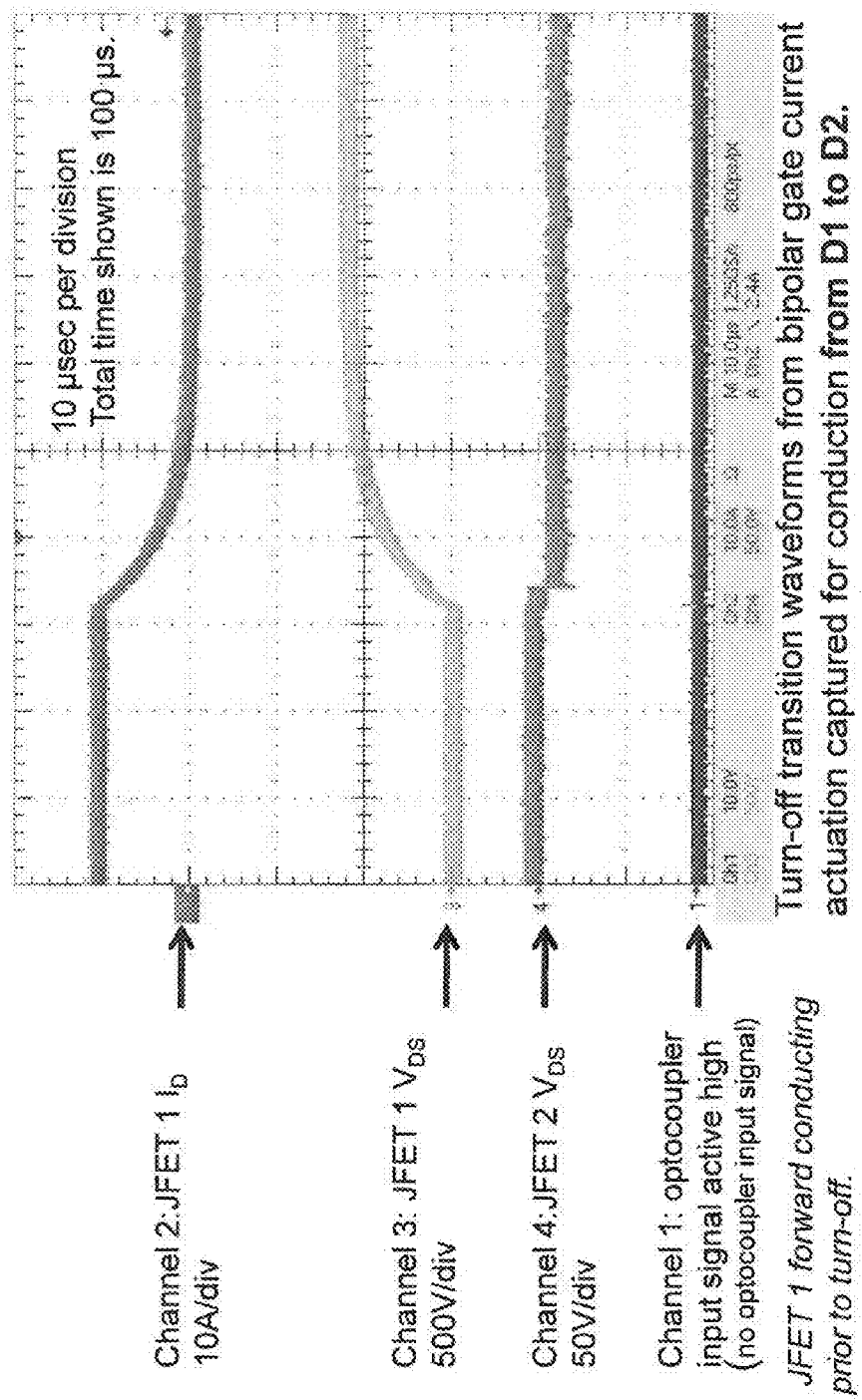
FIG. 10 is a graphical illustration of turn-off transition waveforms from bipolar gate current actuation shown at 10 μsec per division captured for conduction from D1 to D2 (specifically JFET device number 1 forward conduction prior to turn-off).
Figure 11:
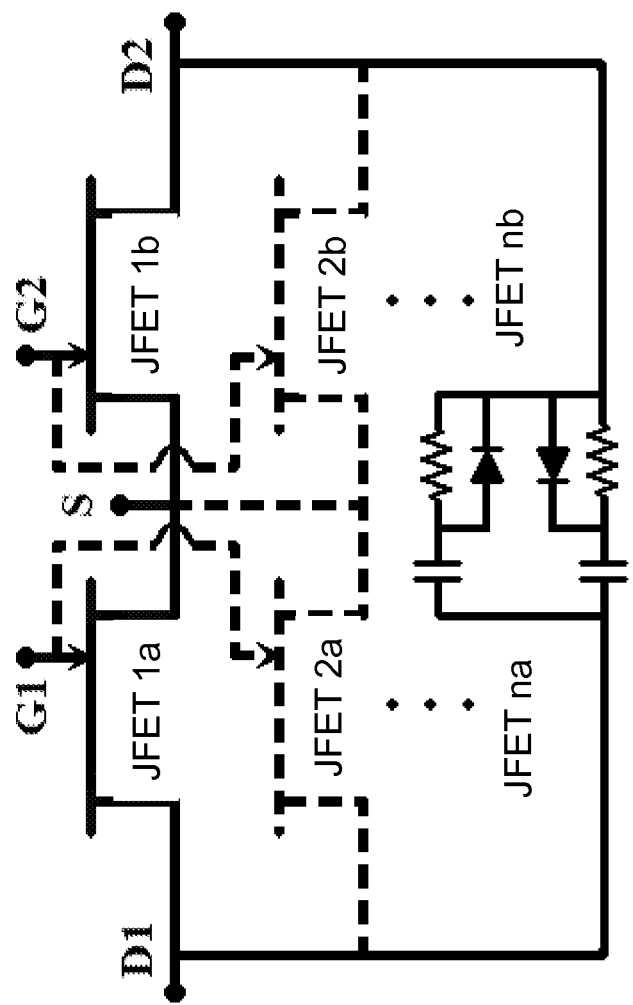
FIG. 11 schematically illustrates a preferred embodiment BDSSCB design with parallel pairs of common-source connected JFETs, and a bidirectional RCD snubber connected across opposite JFET drain terminals to mitigate voltage overshoot from series inductance.
Figure 12:
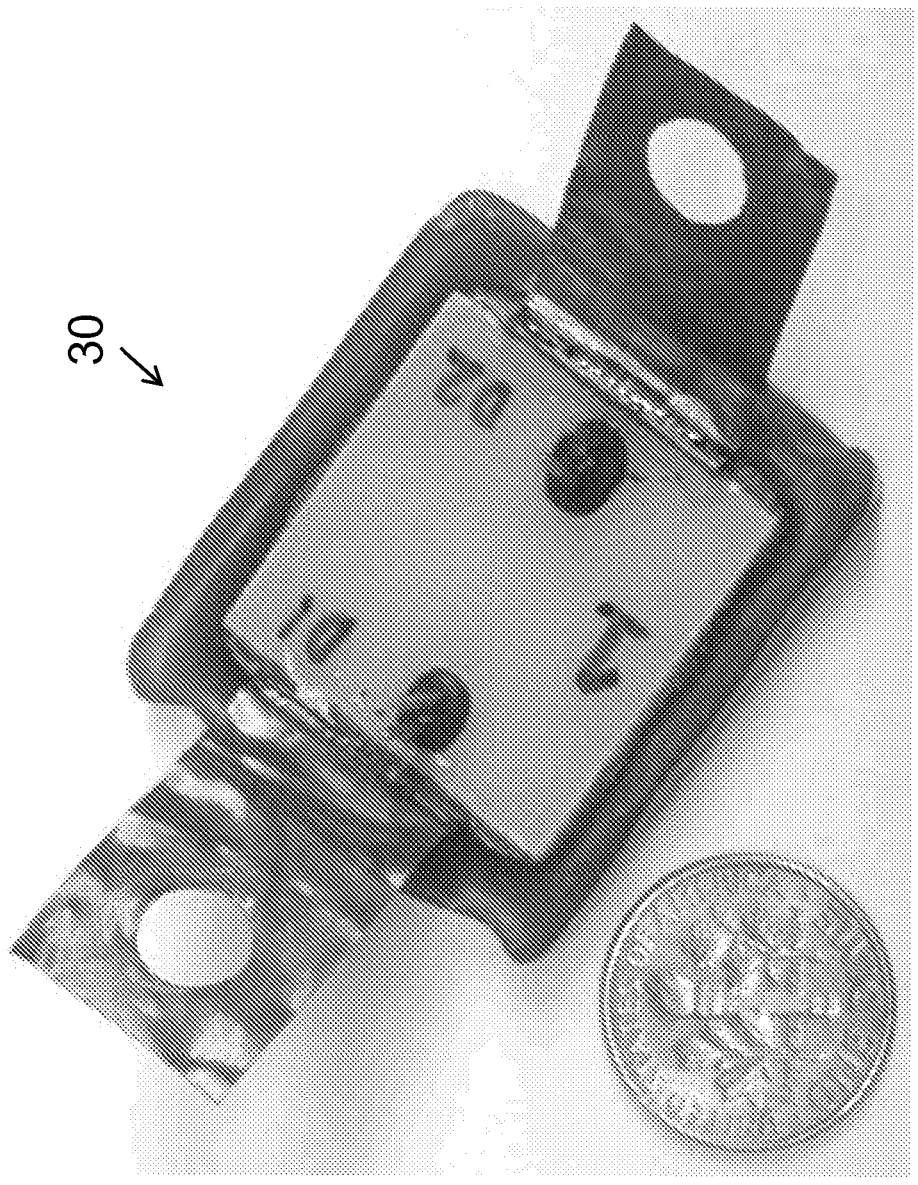
FIG. 12 illustrates a preferred embodiment packaged 30 ampere Bidirectional Solid-State Circuit Breaker JFET module along side of a dime (approx. 17.91 mm (0.705 in)) mathematically revealing a module portion (shown in grey) having both a length and width of approximately 0.95 inches.

Next, the gate driver was tested for bidirectional actuation based on the formation of bipolar gate current in the reverse conducting JFET. From JFET thermal characterization data, fluid circulated through the JFET baseplate was heated to 80° C. to increase JFET conduction voltage drops, resulting in bipolar gate current formation for currents near 10 A. The supply current of the test circuit was increased until a BDSSCB turn-off transition was observed at 11.5 A. With the drain connections of the BDSSCB reversed, the test was repeated with BDSSCB current in the opposite direction and a BDSSCB turn-off transition was observed at 11 A. The small difference in SSCB currents for driver actuation was not unexpected and can be attributed to differences in device parameters. FIGS. 9 and 10 show waveforms acquired during the bipolar gate current actuated gate driver tests for BDSSCB current in both directions. In FIG. 9, BDSSCB current flow was initially from D2 to D1 (referring to those labels in FIG. 6). Channels 1 through 4 correspond to the following waveforms: channel 1: no optocoupler input signal; channel 2: JFET 2 $I_D$, 10 A/div; channel 3: JFET 1 $V_{DS}$, 50 V/div; channel 4: JFET 2 $V_{DS}$, 500 V/div. In FIG. 10, BDSSCB current flow was initially from D1 to D2 (referring to those labels in FIG. 6). Channels 1 through 4 correspond to the following waveforms: channel 1: no optocoupler input signal; channel 2: JFET 1 $I_D$, 10 A/div; channel 3: JFET 1 $V_{DS}$, 500 V/div; channel 4: JFET 2 $V_{DS}$, 50 V/div. For current in either direction, a 2 microsecond delay was observed between the turn-off of the forward conducting JFET (JFET with current flow into its drain) and the reverse conducting JFET (JFET with current flow into its source). This result is based in part on the resistor {R1, R4} and capacitor {C1, C2} values selected during gate driver fabrication. The performance results of the hardware implementation confirm the functionality of the bipolar gate current actuated JFET driver.

In many power switching applications, normally-off devices are preferred over normally-on devices for their ability to block voltage in the absence of control power. However, in many applications, a normally-on fault protection device may be preferred. This can be based on the percentage of system operating time that the protection device spends in the on-state, and on the system reliability impact of damage to the fault protection sub-system, or its malfunction. With the normal bidirectional solid-state circuit breaker (BDSSCB) state being the on-state, system reliability is increased by not needing to provide an active bias to maintain rated conduction. A voltage-controlled, majority-carrier device, having a positive temperature coefficient of on-state resistance, is preferred. These features simplify device control, and promote balanced currents among parallel devices, facilitating current-scalable bidirectional solid-state circuit breakers (BDSSCBs). Junction field effect transistors (JFETs) meet these criteria and can provide additional advantages over metal oxide semiconductor field effect transistors (MOSFETs). Without gate oxides, JFETs can operate at higher temperatures than MOSFETs, and can be more tolerant of high transient voltages as described further in S. Krishnaswami, et al., "Gate oxide reliability of 4H—SiC MOS devices," in Intl. Reliability Physics Symp., 2005, pp. 592-593 and D. Stephani and P. Friedrichs, "Silicon carbide junction field effect transistors, Int. J. of High Speed Electronics and Syst., vol. 16, no. 3, pp. 825-854, September, 2006, both of which are hereby incorporated by reference. Also, the low JFET gate-charge results in fast transition speed and can aid in device current sharing during switching transitions.

Silicon carbide (SiC) 1200-V, 10-A, normally-on, vertical JFETs were developed for a BDSSCB evaluation. Unlike other normally-on SiC JFET devices, that are designed for maximum conduction with a positive gate bias, the BDSSCB JFETs were designed to have a more normally-on characteristic for rated conduction at zero gate bias, as described further in V. Veliadis et al., "Exploring the design space of rugged seven lithographic level silicon carbide vertical JFETs for the development of 1200-V, 50-A devices," in 2007 Int. Semiconductor Device Research Symp., 2007, pp. 1-2, hereby incorporated by reference. Additionally, the JFETs exhibit extremely low leakage currents and sharp onsets of breakdown at both the drain-to-gate and source-to-gate junctions, resulting in stable and efficient operation, as described further in V. Veliadis et al., "A 2055-V (at 0.7 mA/cm2), 24-A (at 706 W/cm2) normally-ON 4H—SiC JFET with 0.068-cm2 active area and blocking voltage capability of 94% of the SiC material limit," IEEE Electron Device Lett., vol. 29, no. 12, pp. 1325-1327, December, 2008 and V. Veliadis, et al., "A 1680 V (at 1 mA/cm2), 54 A (at 780 W/cm2) normally-ON 4H—SiC JFET with 0.143 cm2 active area," IEEE Electron Device Lett., vol. 29, no. 10, pp. 1132-1134 October, 2008, both of which are hereby incorporated by reference.

A preferred embodiment comprises a scalable bidirectional solid-state circuit breaker (BDSSCB) for fast fault protection, in power electronic systems having bidirectional current flow. The BDSSCBs exhibit near symmetric bidirectional current-conduction and voltage-blocking capability using silicon carbide (SiC) junction field effect transistors (JFETs) and are controlled by an efficient self triggering gate driver. In addition to AC systems, DC power electronic systems such as those of hybrid electric vehicle drives stand to benefit from this technology. BDSSCBs provide important advantages over their conventional mechanical counterparts BDSSCBs can provide fault protection with dramatic improvements in reliability and operating life, resulting in superior system protection and reduced maintenance and actuation that is faster than mechanical fault protection devices. Many AC and bidirectional DC systems, especially those having power electronic components, stand to benefit significantly from these advantages. SiC normally-on JFETs are well suited to the BDSSCB application due to their: normally-on state, ability to bidirectionally conduct with low resistance (relative to other semiconductor device structures) in both the forward and reverse direction, positive temperature coefficient, and high operating temperature capability.

SiC 0.1-cm$^2$ JFETs may be utilized to have a more normally-on characteristic specifically for a common-source BDSSCB design, which allows higher bidirectional conduction currents at a zero-volt JFET gate bias, and enables bipolar gate current to be used as a means of detecting JFET overcurrent conditions, while inherently compensating for device temperature. A novel BDSSCB gate driver was designed for bipolar gate current actuated, or externally actuated turn-off. The BCAD driver was evaluated successfully on a small-scale 10-A BDSSCB, with current flow in both directions, having two common-source connected 0.1-cm$^2$ SiC JFETs.

As depicted in FIGS. 13-16, a preferred embodiment of the present invention may be used in:

Hybrid electric vehicle systems
Grid-tie renewable energy inverter systems
Bidirectional DC-DC converters
Charge and discharge of energy storage systems
Regenerative power (brakes, elevators, etc.)

Figure 13:
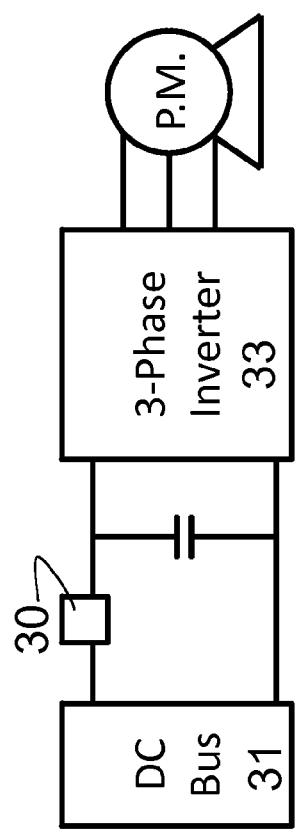
FIG. 13 illustrates application of the Bidirectional Solid-State Circuit Breaker JFET module.

FIG. 13 schematically depicts an application of the BDSSCB gate driver circuitry 30 connected between a DC bus 31 and a 3-phase inverter 33.

Figure 14:
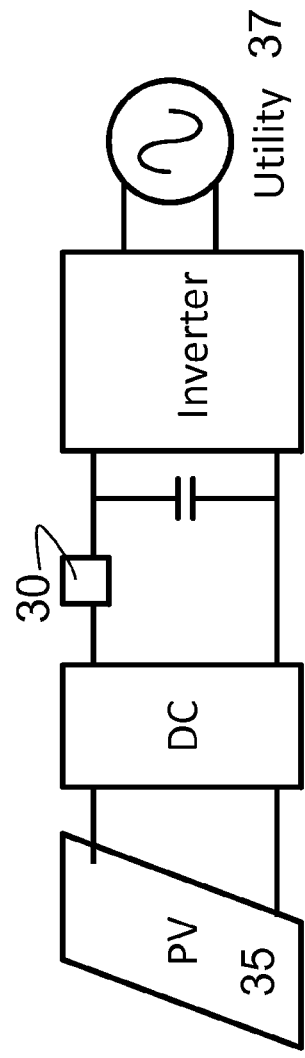
FIG. 14 illustrates application of the Bidirectional Solid-State Circuit Breaker JFET module used in conjunction with connection of a photovoltaic source to a utility.

FIG. 14 illustrates an application of the Bidirectional Solid-State Circuit Breaker JFET module 30 used in conjunction with connection of a photovoltaic source 35 to a utility 37.

Figure 15:
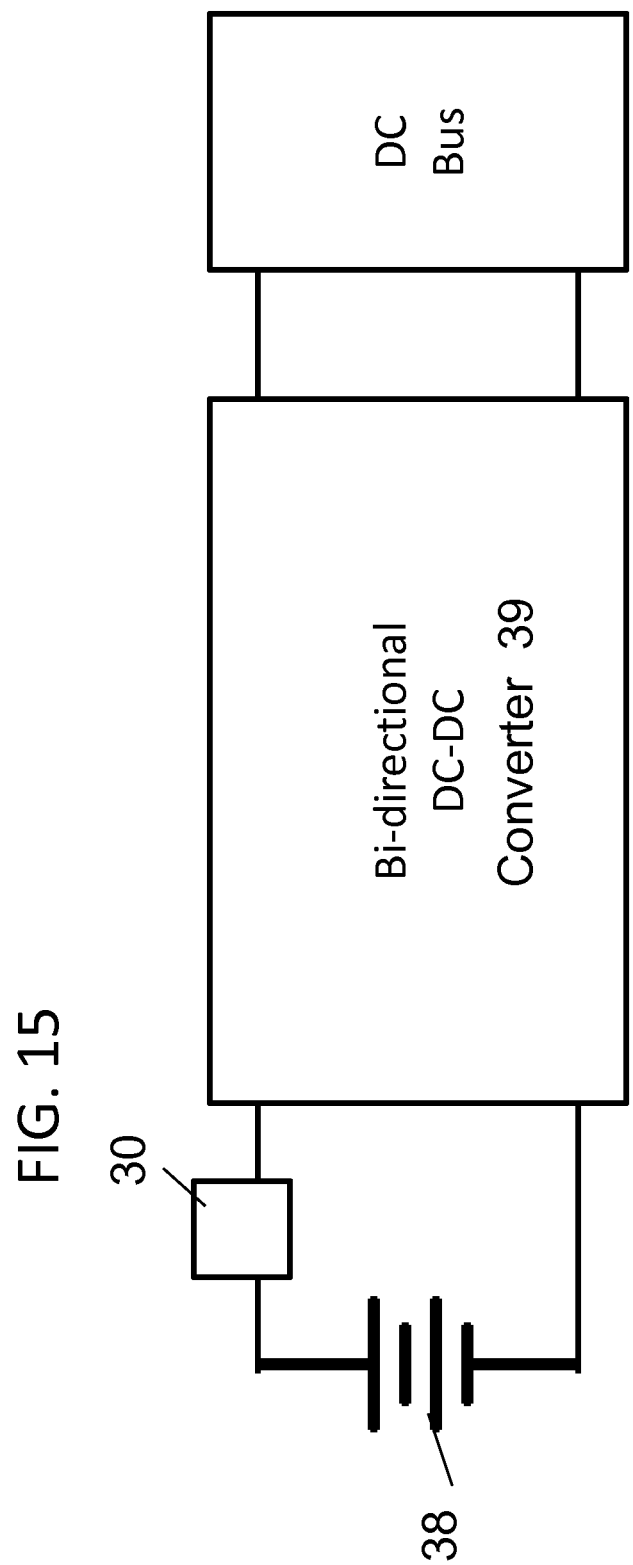
FIG. 15 illustrates application of the Bidirectional Solid-State Circuit Breaker JFET module used in conjunction with connection of a battery source to bidirectional DC-DC device.

FIG. 15 illustrates an application of the Bidirectional Solid-State Circuit Breaker JFET module 30 used in conjunction with the connection of a battery source 38 to a bidirectional DC-DC converter 39.

Figure 16:
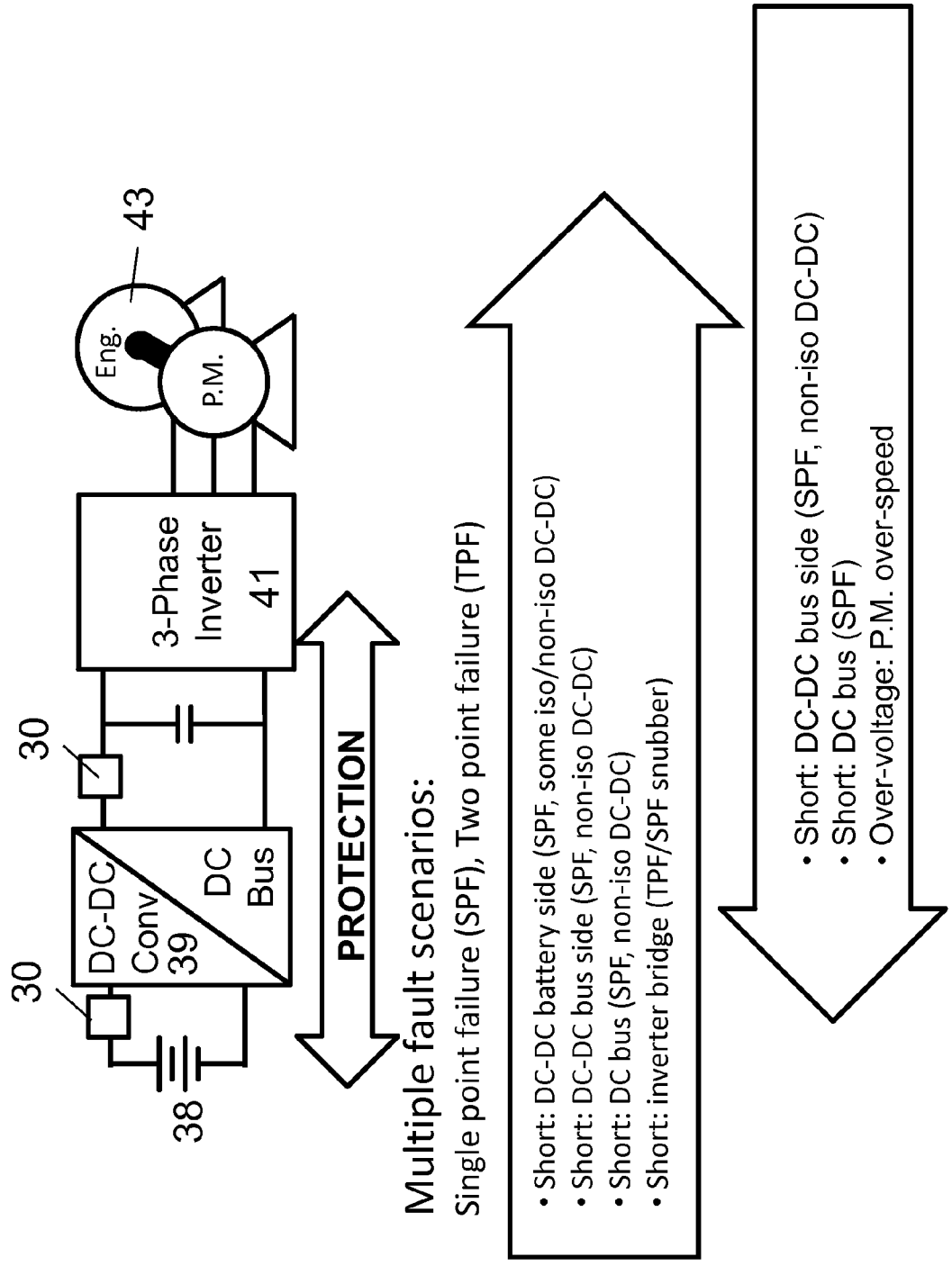
FIG. 16 illustrates multiple fault detection scenarios using at least one preferred embodiment of the present invention.

FIG. 16 illustrates an application of the Bidirectional Solid-State Circuit Breaker JFET module 30 used in conjunction with the connection of a battery source 38 to a bidirectional DC-DC converter 39. The bidirectional DC-DC converter 39 is operatively connected to a 3-phase inverter 41 and engine 43. The modules 30 afford protection against both single point failures (SPF) and two point failures (TPF) in multiple fault detection scenarios. The possible SPF and TPF locations of shorts in the circuitry of FIG. 16 include:

(A) Short: DC-DC battery side (SPF, some iso/non-iso DC-DC)
(B) Short: DC-DC bus side (SPF, non-iso DC-DC)
(C) Short: DC bus (SPF, non-iso DC-DC)
(D) Short: inverter bridge (TPF/SPF snubber)
(E) Short: DC-DC bus side (SPF, non-iso DC-DC)(F) Short: DC bus (SPF)
(G) Over-voltage: P.M. over-speed The Bidirectional Solid-State Circuit Breaker JFET module applications for the present invention include, for example, distributed and off-grid power systems and hybrid-electric ground vehicle power systems, power electronic converters and power distribution equipment operating at up to several hundred volts and up to hundreds of kilowatts. To prevent damage to converters or other system components during fault conditions, fault current interrupt speeds in tens to hundreds of microseconds can be necessary. In many of these systems, AC and DC power components operate between two voltage busses having independent sourcing capability, and require bidirectional fault isolation. Such conditions can require fault protection systems having symmetric ratings for bidirectional voltage blocking in the off-state and bidirectional current conduction in the on-state. Mechanical contactors do not provide adequate actuation speeds in many applications, and suffer severe degradation during repeated fault isolation. A BDSSCB, as described in the foregoing, overcomes these deficiencies. A preferred embodiment may comprise a set of normally-on junction field effect transistors (JFETs) fabricated from wide band gap semiconductor material having a collectively low conduction loss to provide large current handling capability and fast transition speed for current interruption. Advanced gate drivers are being developed for SiC vertical JFET (VJFET) devices. A preferred embodiment may be used in conjunction with JFETs that have voltage blocking ratings at or above 1200 V, and low drain-to-source resistances for scalable BD SS CB applications.

A preferred embodiment comprises a scalable bidirectional solid-state circuit breaker (BDSSCB) capable of fast fault protection, in power electronic systems having bidirectional current flow. A preferred embodiment exhibits symmetric bidirectional current-conduction and voltage-blocking capability using novel Silicon Carbide (SiC) junction field effect transistors (JFETs) controlled by an efficient self triggering gate driver. Bidirectional solid-state circuit breakers (BDSSCBs) provide important advantages over their conventional mechanical counterparts. Even coupled with transient voltage suppression components, preferred embodiment bidirectional BDSSCBs may achieve actuation times three orders of magnitude lower. BDSSCBs may also offer dramatic improvements in reliability and operating life, resulting in superior system protection and reduced maintenance.

As used herein the terminology latch includes the elements disclosed in FIG. 1, such as a UJT, which is normally-off (open) but is turned-on (closed) when activated and remains in the on-state until reset.

As used herein the terminology switch includes a transistor such as a MOSFET, but is not limited to a MOSFET and may be a switch element.

As used herein the terminology resettable fuse or fuse refers to a self triggered or internally triggered device that opens when triggered and includes a transient blocking unit, and the terminology "open" or "activated" refers to when the fuse is blown or when current is blocked.

As used herein, the terminology MOSFET means metal oxide semiconductor field effect transistor.

As used herein, the terminology "predetermined threshold" correlates to an overflow or overload situation (in which the circuit breaker is designed to open) when a bipolar gate current flows through the common-source connection, enters the gate driver and passes through the gate/drain junction of the reverse conducting JFET.

As used herein the terminology JFETs is the plural of JFET which means junction field effect transistor.

As used herein, the terminology BJT correlates to bipolar junction transistor.

As used herein, bipolar gate current, as referred to herein, shall be the current flowing through the gate-to-drain junction of a reverse conducting JFET with that current flowing into the gate connection and flowing out of the drain connection of the JFET.

The foregoing description of the specific embodiments are intended to reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

The invention claimed is:

1. A circuit breaker comprising
   first and second JFETs the first JFET comprising a first gate, first drain and first source connection, the second JFET comprising a second gate, second drain and second source connection; the first and second sources being operatively connected to each other to form a common-source connection, the first and second drains adapted to be connected to an external circuit having a current flowing therein, the circuit breaker operating to open the external circuit when the current flowing through the JFETs exceeds a predetermined threshold, the first and second gates, and common-source connection being operatively connected to a gate driver circuit which causes the JFETs to turn off when the predetermined threshold is exceeded;

whereby when a predetermined threshold is exceeded, current flows through the common-source connection, into the gate driver circuit, and into the second gate which causes the gate driver circuit to turn off the first and second JFETs and open the circuit breaker.

2. The circuit breaker of claim 1 wherein the gate driver circuit comprises:

a voltage source comprising positive and negative terminals; the voltage source operating to supply a negative voltage to the first and second gates when the predetermined threshold is exceeded; the common-source connection being operatively connected to the positive terminal;

first and second resettable fuses, each resettable fuse having first and second fuse terminals, the first fuse terminals being operatively connected to the positive terminal and second fuse terminals each being connected to the first and second gates;

first and second latches operatively connected to the first and second resettable fuses, the first and second latches being normally in an off mode and operating to activate when there is a sufficient voltage differential across one of the first or second resettable fuses; each of the first and second resettable fuses being operatively connected to one of the first and second latches such that when a latch is activated, a fuse is activated;

first and second switch elements operatively connected to the first and second latches, the first and second gates and the negative terminal, the first switch element allowing current when the first latch is activated and the second switch element allowing current when the second latch is activated; the activation of the first switch element operating to connect the negative terminal to the first gate to turn off the first JFET; the activation of the second switch element operating to operatively connect the negative terminal to the second gate;

whereby when a predetermined threshold is exceeded, the current flows through the common-source connection into the gate of at least one of the JFETs causing a sufficient voltage differential across the second fuse, causing the first latch to activate which (a) activates the first switch element causing the first gate to become negative and turn off the first JFET and (b) opens the first resettable fuse and activates the second latch which activates the second switch element thereby causing the second gate to become negative and turn off the second JFET, and causing the second fuse to open.

3. The circuit breaker of claim 2 wherein the circuit breaker will detect the predetermined threshold and open the external circuit for a current flowing through the JFETs from either direction.

4. The circuit breaker of claim 3 wherein the JFET where the current enters the drain corresponds to the leading JFET and the JFET where the current exits the drain corresponds to the trailing JFET, and wherein the second gate corresponds to the gate of the trailing JFET and the first gate corresponds to the gate of the leading JFET, and when the current exceeds the predetermined threshold, an overflow current flows through the common-source connection into the second gate causing a sufficient voltage differential across the second fuse, causing the first latch to activate.

5. The circuit breaker of claim 2 wherein at least one of the first and second latches comprises a PNP transistor, an NPN transistor and a diode, each of the PNP and NPN transistors having an emitter, gate and collector, the collector of the NPN transistor being operatively connected to the gate of the PNP transistor at a first junction, and the diode having a diode anode and a diode cathode, the diode anode being connected to the first junction and the diode cathode being connected to the emitter of the PNP transistor at the anode of each latch, and the emitter of the NPN transistor forming the cathode of each latch.

6. The circuit breaker of claim 2 wherein the first and second switch elements are each selected from the group consisting of a MOSFET, another type of transistor, a switch element, or a thyristor.

7. The circuit breaker of claim 2 wherein the voltage source is one of a battery or switching converter.

8. The circuit breaker of claim 2 wherein the JFETs are normally turned-on with approximately a zero-volt gate bias and wherein the gate driver latches its output in the JFET off-state when the predetermined threshold is met, until the driver output is reset.

9. The circuit breaker of claim 2 further comprising first and second optical couplers which bypass the first and second latches, respectively, the first and second optical couplers being activated by light responsive to manual operation or a sensed condition, such as a level of predetermined current passing through the circuit breaker, such that when at least one optical coupler is manually activated or activated by a sensor, at least one of the first and second switch elements is activated causing the circuit breaker to activate and open the external circuit.

10. The circuit breaker of claim 1 wherein the predetermined threshold is based upon a maximum $V_{SD}$ value based upon the JFET device power dissipation limit and wherein the predetermined threshold is exceeded, the current flowing through the common-source connection, into the gate driver circuit and into the second gate is a bipolar gate current created when the voltage differential between the common-source connection and the second drain exceed the maximum rated $V_{SD}$ value.

11. A circuit breaker comprising leading and trailing JFETs; the leading JFET comprising a first gate, first drain and first source connection, the trailing JFET comprising a second gate, second drain and second source connection; the first and second sources being operatively connected to each other to form a common-source connection, the first and second drains adapted to be connected to an external circuit having a current flowing therein, the circuit breaker operating to open when the current flows through the JFETs exceeds a predetermined threshold, the first and second gates, and common-source connection being operatively connected to a gate driver circuit which causes the JFETs to turn off when the predetermined threshold is exceeded;

the gate driver circuit comprising:

a voltage source comprising positive and negative terminals; the voltage source operating to supply a negative voltage to the first and second gates when the predetermined threshold is exceeded; the common-source connection being operatively connected to the positive terminal;

first and second resettable fuses, each resettable fuse having first and second fuse terminals, the first fuse terminals being operatively connected to the positive terminal and second fuse terminals each being connected to one of the first and second gates;

first and second latches operatively connected to the first and second resettable fuses, the first and second latches being normally in an off-mode and operating to activate when there is a sufficient voltage differential across one of the first or second resettable fuses; each of the first and second resettable fuses being operatively connected to one the first and second latches such that when a latch is activated, a fuse is activated;

first and second switch elements operatively connected to the first and second latches, the first and second gates and the negative terminal, the first switch element turning-on when the first latch is activated and the second switch element turning-on when the second latch is activated; the activation of the first switch element operating to connect the negative terminal to the first gate to turn off the leading JFET; the activation of the second switch element operating to operatively connect the negative terminal to the second gate;

whereby when a predetermined threshold is exceeded, the current flows through the common-source connection into the gate of the trailing JFET causing a sufficient voltage differential across the second fuse, causing the first latch to activate which (a) activates the first switch element causing the first gate to become negative and turn off the leading JFET and (b) opens the first resettable fuse and activates the second latch which activates the second switch element thereby causing the second gate to become negative and turn off the trailing JFET, and causing the second fuse to open.

12. The circuit breaker of claim 11 wherein the circuit breaker will detect the predetermined threshold and open the external circuit for a current flowing through the JFETs from either direction, and when the current is reversed, the leading JFET becomes the trailing JFET and the trailing JFET becomes the leading JFET.

13. The circuit breaker of claim 12 wherein the second gate corresponds to the gate of the trailing JFET and the first gate corresponds to the gate of the leading JFET, and when the current exceeds the predetermined threshold, a bipolar gate current flows through the common-source connection into the second gate causing a sufficient voltage differential across the second fuse, causing the first latch to activate.

14. The circuit breaker of claim 11 wherein at least one of the first and second latches comprises a PNP transistor, an NPN transistor and a diode, each of the PNP and NPN transistors having an emitter, gate and collector, the collector of the NPN transistor being operatively connected to the gate of the PNP transistor at a first junction, and the diode having a diode anode and a diode cathode, the diode anode being connected to the first junction and the diode cathode being connected to the emitter of the PNP transistor at the anode of each latch, and the emitter of the NPN transistor forming the cathode of each latch.

15. The circuit breaker of claim 11 wherein the first and second switch elements each comprise a transistor or switch element including a thyristor.

16. The circuit breaker of claim 11 wherein the voltage source is one of a battery or switching converter.

17. The circuit breaker of claim 11 wherein the JFETs are normally turned on with approximately a zero-volt gate bias.

18. The circuit breaker of claim 11 further comprising first and second optical couplers which bypass the first and second latches, respectively, the first and second optical couplers being activated by light responsive to manual operation or a sensed condition, such as a level of predetermined current passing through the circuit breaker, such that when at least one optical coupler is manually activated or activated by a sensor, at least one of the first and second switch elements is activated, causing the circuit breaker to activate and open the external circuit.

19. The circuit breaker of claim 11 wherein the voltage source provides a negative voltage to the first and second gates upon activation of the first and second switch elements.

20. A method of sensing an overload in a circuit breaker comprising:
operatively connecting leading and trailing JFETs in a circuit to open the circuit and prevent current flow when a predetermined threshold is exceeded; the leading and trailing JFETs being connected to each other through a common source connection; and
operatively connecting a gate driver circuit to the common-source connection and the gates of each of the leading and trailing JFETs, such that when a bipolar gate current passes through the common source connection through the gate driver circuitry and into the gate of the trailing JFET and out of the drain of the trailing JFET, the gate driver circuitry turns off the leading and trailing JFETs.

* * * * *